United States Patent [19]
Ashida et al.

[11] Patent Number: 6,067,230
[45] Date of Patent: May 23, 2000

[54] ELECTRONIC DEVICE WITH HEAT RADIATION MEMBERS

[75] Inventors: Takayuki Ashida; Katsunori Kuroki; Takayoshi Tanemura, all of Kawasaki, Japan

[73] Assignee: Fujitsu Limited, Kawasaki, Japan

[21] Appl. No.: 09/188,716

[22] Filed: Nov. 10, 1998

[30] Foreign Application Priority Data

Jun. 10, 1998 [JP] Japan ................................. 10-162372

[51] Int. Cl.[7] ........................................................ H05K 7/20
[52] U.S. Cl. ..................... 361/704; 165/80.3; 174/16.3; 257/722; 257/719; 361/690; 361/717
[58] Field of Search ............................ 165/80.2, 80.3, 165/185; 174/16.3; 257/706–707, 712–714, 718–719, 721, 720, 722; 361/687–690, 699, 703–704, 707–711, 717–721

[56] References Cited

U.S. PATENT DOCUMENTS 5,504,650  4/1996  Katsui et al. .
5,705,850  1/1998  Ashiwake et al. ........................ 257/714
5,751,062  5/1998  Daikoku et al. ......................... 257/722

FOREIGN PATENT DOCUMENTS

6-268125  9/1994  Japan .

*Primary Examiner*—Gregory Thompson
*Attorney, Agent, or Firm*—Armstrong, Westerman, Hattori, McLeland and Naughton

[57] ABSTRACT

An electronic device including a circuit part having a semiconductor chip. The device includes a first heat radiation member kept in contact with the circuit part for radiating the heat generated by the circuit part, a second heat radiation member, and an intermediate member 32. Fins of the intermediate member are fitted in or on the fins of the first heat radiation member, and the base portion of the intermediate member is coupled to the base portion of the second heat radiation member. Therefore, the second heat radiation member can be conveniently added to the first heat radiation member via the intermediate member.

16 Claims, 12 Drawing Sheets

ELECTRONIC DEVICE WITH HEAT RADIATION MEMBERS

BACKGROUND OF THE INVENTION

1. Field of the Invention

The present invention relates to an electronic device comprising heat radiation members arranged on two levels for radiating heat generated by a circuit part.

2. Description of the Related Art

A semiconductor circuit part generates heat in use, and a heat radiation member called a heat sink is attached to the circuit part to cool it. Also, the circuit part with the heat radiation member attached thereto is cooled by cooling air. Among circuit parts, an MPU is an especially important part and generates much heat and, therefore, requires sufficient cooling.

A circuit part with a heat radiation member attached thereto operates smoothly under a predetermined operating condition, but may not operate so well under a more difficult operating condition. For example, a circuit part with a heat radiation member attached thereto, which is designated to be used in an environment of 50° C., operates smoothly under the designated condition but sometimes fails to operate smoothly in an environment of 70 to 80° C.

In a different operating condition, therefore, it is necessary to use a heat radiation member of a different heat radiation characteristic. In a circuit part with a specific heat radiation member fixed thereto, however, it is not easy to remove the heat radiation member from the circuit part and attach another heat radiation member to the circuit part, and such a mounting/demounting work often results in a higher cost. Therefore, it is sometimes better to improve the heat radiation characteristic of the circuit part while the originally attached heat radiation member is kept on the circuit part.

SUMMARY OF THE INVENTION

The object of the present invention is to provide an electronic device having a heat radiation performance suitable for a desired operating temperature condition by adding a new heat radiation member to a circuit part having an initially attached heat radiation member.

An electronic device according to the present invention comprises a circuit part, a first heat radiation member having a first base portion in contact with the circuit part and first fins arranged on the first base portion for radiating heat generated by the circuit part, a second heat radiation member including a second base portion and second fins arranged on the second base portion, and an intermediate member having a third base portion and third fins arranged on the third base portion, the third fins of the intermediate member being fitted in the first fins and the third base portion of the intermediate member being coupled to the second base portion of the second heat radiation member.

In this arrangement, an electronic device, having a heat radiation performance suitable for a desired operating temperature condition, can be obtained by adding the second heat radiation member to the circuit part with the first heat radiation member attached thereto. The second heat radiation member is coupled to the first heat radiation member by the intermediate member fixedly fitted in the first fins. Therefore, heat generated by the circuit part is partly radiated by the first heat radiation member and partly transmitted to and radiated by the second heat radiation member. Thus, the circuit part is maintained always at a desired low temperature and can operate as intended.

The invention can preferably include the following features as well as the above-mentioned configuration.

The third base portion of the intermediate member is smaller than the first base portion of the first heat radiation member. The second base portion of the second heat radiation member is larger than the base portion of the first heat radiation member. The third base portion of the intermediate member is substantially equal to or larger than a heat-generating area of the circuit part.

The intermediate member is formed integral with the second heat radiation member, or formed separately from the second heat radiation member. In the latter case, the intermediate member is formed of a material different from the second heat radiation member. The third base portion of the intermediate member includes a portion which laterally extends from the area in which the third fins are arranged. The third base portion of the intermediate member is bonded to the second base portion of the second heat radiation member. A layer for enhancing the degree of contact is arranged between the third base portion of the intermediate member and the second base portion of the second heat radiation member. The second base portion of the second heat radiation member includes a layer of high heat conductivity.

The second fins of the second heat radiation member are divided into a plurality of fin areas, each of which is removably mounted on the second base portion.

The circuit part is mounted to a first substrate. The second heat radiation member is fixed to the first substrate. The second heat radiation member is adjustably fixed to the first substrate. The first substrate is mounted to a second substrate by fasteners, and the second heat radiation member is fixed to the first substrate using the same fasteners. The second heat radiation member is fixed by a spring member to the substrate on which the circuit part is mounted.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
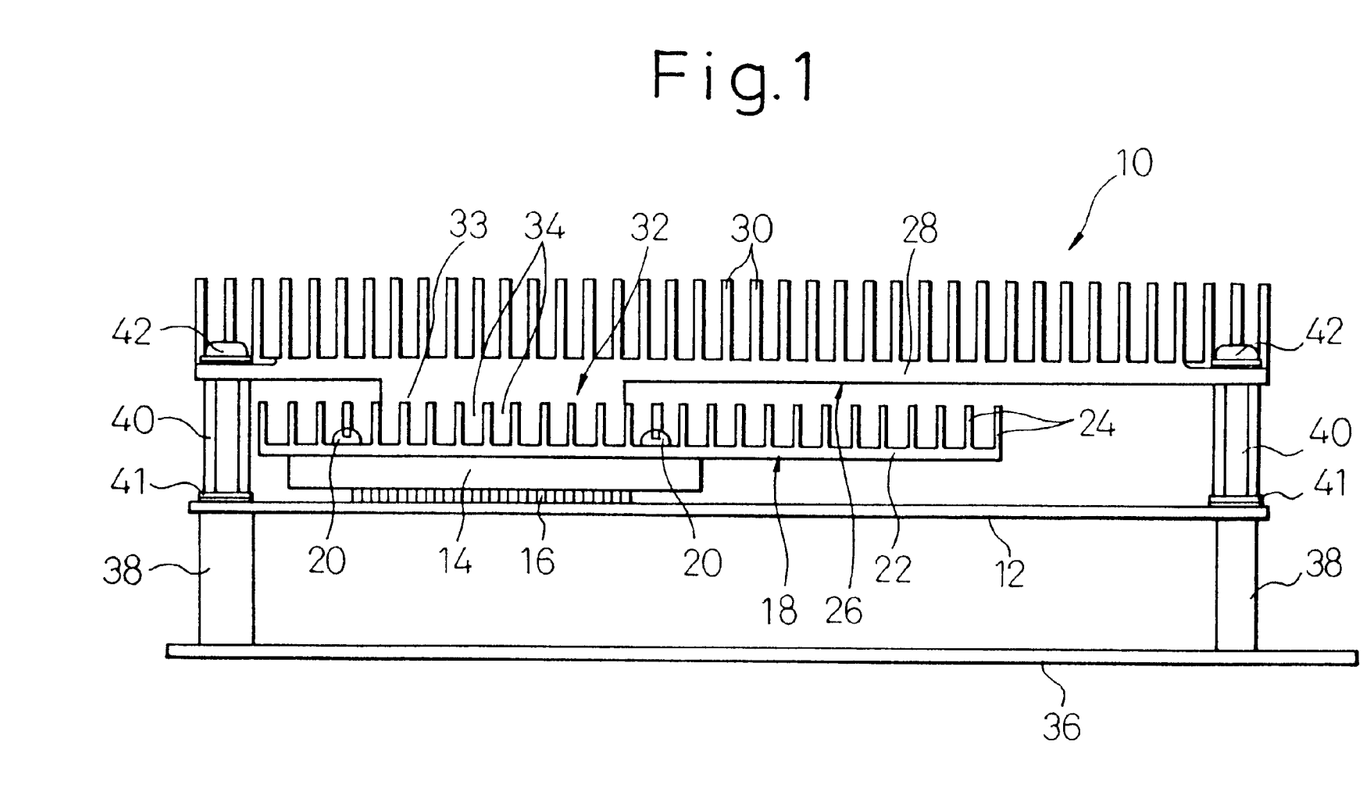
FIG. 1 is a side view showing an electronic device according to the first embodiment of the present invention.
Figure 2:
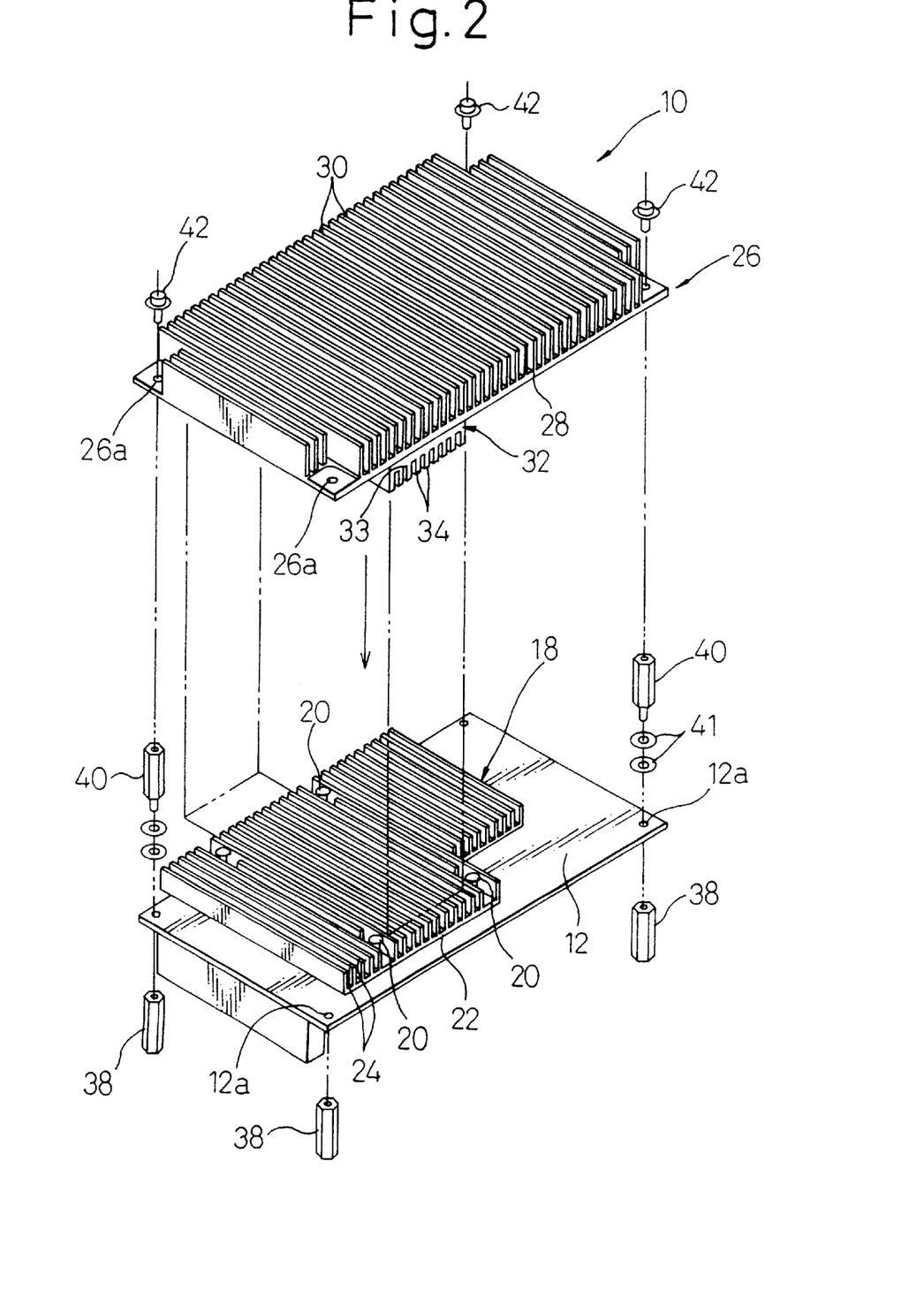
FIG. 2 is an exploded perspective view of the electronic device of FIG. 1.

FIG. 1 is a side view showing an electronic device according to the first embodiment of the present invention, and FIG. 2 is a perspective view of the electronic device of FIG. 1. The electronic device 10 includes a substrate 12 such as a printed board, and a circuit part 14 mounted to the substrate 12. The substrate 12 has printed circuits and through holes (not shown). The circuit part 14 includes legs 16, which are connected to the through holes of the substrate 12.

A first heat radiation member 18 is fixed to the circuit part 14 by screws 20. The first heat radiation member 18 has a first base portion 22 in the form of a flat plate and first fins 24 extending from the first base portion 22. The first base portion 22 is in contact with the circuit part 14, and the first fins 24 extend upward from the first base portion 22 in parallel to each other. Heat generated by the circuit part 14 is transmitted to the first base portion 22 and radiated by the first fins 24.

The electronic device 10 can be shipped in this state as a product. Specifically, the electronic device 10 can be supplied with the first heat radiation member 18 attached to the circuit part 14 and can be used in this state. In the case where the operating temperature is comparatively low, the circuit part 14 smoothly operates under this condition. In the case where the operating temperature is comparatively high, however, the heat radiation performance of the first heat radiation member 18 may be sometimes insufficient, with the result that the operation of the circuit part 14 becomes unstable. In such a case, a second heat radiation member 26 is added to enhance the heat radiation performance.

Figure 3:
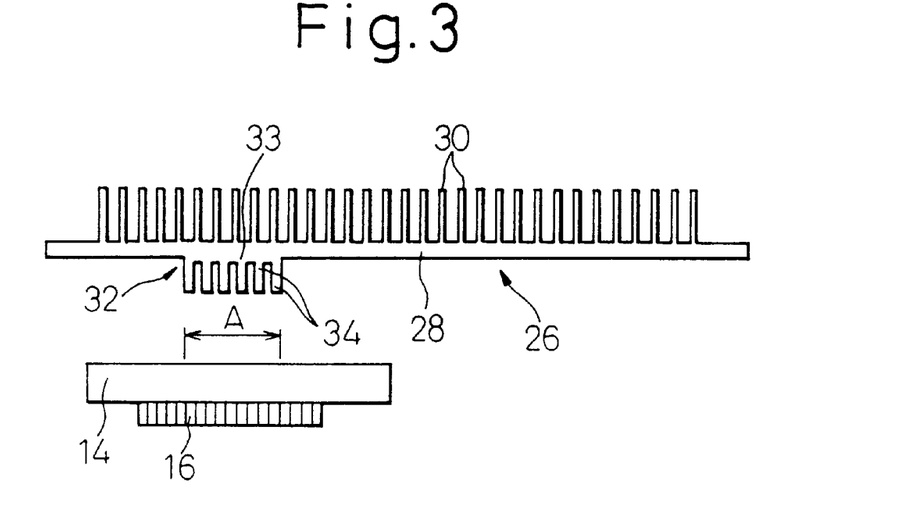
FIG. 3 is a side view showing the second heat radiation member.

The second heat radiation member 26 is coupled to the first heat radiation member 18 by an intermediate member 32. As shown in FIGS. 1 to 3, the second heat radiation member 26 includes a second base portion 28 formed in the form of a flat plate and second fins 30 extending from the second base portion 28. The intermediate member 32 includes a third base portion 33 and third fins 34 extending from the third base portion 33. In this embodiment, the second heat radiation member 26 is formed integrally with the intermediate member 32. The second fins 30 extend upward from the second base portion 28 in parallel to each other. The third base portion 33 of the intermediate member 32 is integrally coupled to the second base portion 28, and the third fins 34 extend downward from the third base portion 33 in parallel to each other.

The third fins 34 of the intermediate member 32 are snugly fitted in or on the fins 24 of the first heat radiation member 18. Preferably, the third fins 34 are bonded to the first heat radiation member 18 by an adhesive. In the case where there is a gap between the third fins 34 and the first fins 24, however, a thermally conductive grease can be filled therein. As a result, there is no air layer between the first fins 24 and the third fins 34, so that the second heat radiation member 26 is coupled to the first heat radiation member 18 at the intermediate member in a good heat transmitting relationship. Heat generated by the circuit part 14 is thus transmitted from the first heat radiation member 18 to the second heat radiation member 26. Consequently, heat generated by the circuit part 14 is radiated partly by the first heat radiation member 18 and partly by the second heat radiation member 26. As a result, the circuit part 14 is maintained always at a desired low temperature and can perform the operation as intended.

The first fins 24, the second fins 30 and the third fins 34 extend in the same direction and in parallel to each other. The cooling air passes through the paths between the first fins 24 and the paths between the second fins 30 thereby to cool the first fins 24 and the second fins 30.

Further, the third base portion 33 of the intermediate member 32 is smaller than the first base portion 22 of the first heat radiation member 18. Although the third base portion 33 of the intermediate member 32 is comparatively small as described, heat generated by the circuit part 14 can be transmitted from the first heat radiation member 18 to the second heat radiation member 26 and radiated by the second heat radiation member 26 as long as the third fins 34 of the intermediate member 32 closely contact the first fins 24 of the first heat radiation member 18 without any air layer therebetween. Also, the second base portion 28 of the second heat radiation member 26 is larger than the first base portion 22 of the first heat radiation member 18. As a result, the large area of the second heat radiation member 26 can be exposed to cooling air.

The third base portion 33 of the intermediate member 32 is preferably substantially equal to or larger than the heat-generating area of the circuit part 14. In FIG. 3, the circuit part 14 includes a semiconductor chip (not shown) which is an actual heat-generating member, and the area of the semiconductor chip is designated by "A". The semiconductor chip area "A" is substantially equal to the heat-generating area of the circuit part 14. Also, the third base portion 33 of the intermediate member 32 is preferably located just above the heat-generating area of the circuit part 14. By doing so, even though the third base portion 33 of the intermediate member 32 is comparatively small, considerable part of the heat generated by the circuit part 14 is transmitted to the second heat radiation member 26 to thereby promote the heat radiation of the circuit part 14. Also, the thermal resistance due to the air layer can be suppressed by adding an adhesive or a grease of high heat conductivity between the connecting surfaces of adjacent members.

The substrate 12 can be mounted to a second printed board 36 by distance rods 38 and screws (distance rods 40 in this case). The upper end of each distance rod 38 has a threaded hole and the lower end thereof is provided with a screw. In a similar fashion, the upper end of each distance rod 40 is has a threaded hole and the lower end thereof is provided with a screw. The lower end of each distance rod 38 is passed through a hole (not shown) of the second printed board 36 and screwed there.

The substrate 12 is located between the distance rods 38 and the distance rods 40. The substrate 12 is located at the upper ends of the distance rods 38 and the screws at the lower ends of the distance rods 40 are screwed to the threaded holes at the upper ends of the distance rods 38 through the holes 12a of the substrate 12. The substrate 12, therefore, is fixed to the second printed board 36 in a predetermined spaced relationship by the distance rods 38.

The second heat radiation member 26 is rested on the upper ends of the distance rods 40 and the screws 42 are screwed in the threaded holes of the distance rods 40 through the holes 26a of the second heat radiation member 26. The second heat radiation member 26, therefore, is fixed to the substrate 12 in a predetermined spaced relationship by the distance rods 40. In this way, the substrate 12 is mounted to the second substrate 36 by the distance rods (fasteners) 38 and 40, and the second heat radiation member 26 is fixed to the substrate 12 using the distance rods (fasteners) 38 and 40. This sharing of the fasteners can minimize the size of the mounting holes 12a of the substrate 12 and the printed board 36. As a result, the rigidity of the system as a whole is improved, and the resistance to vibration shocks is increased.

Figure 4:
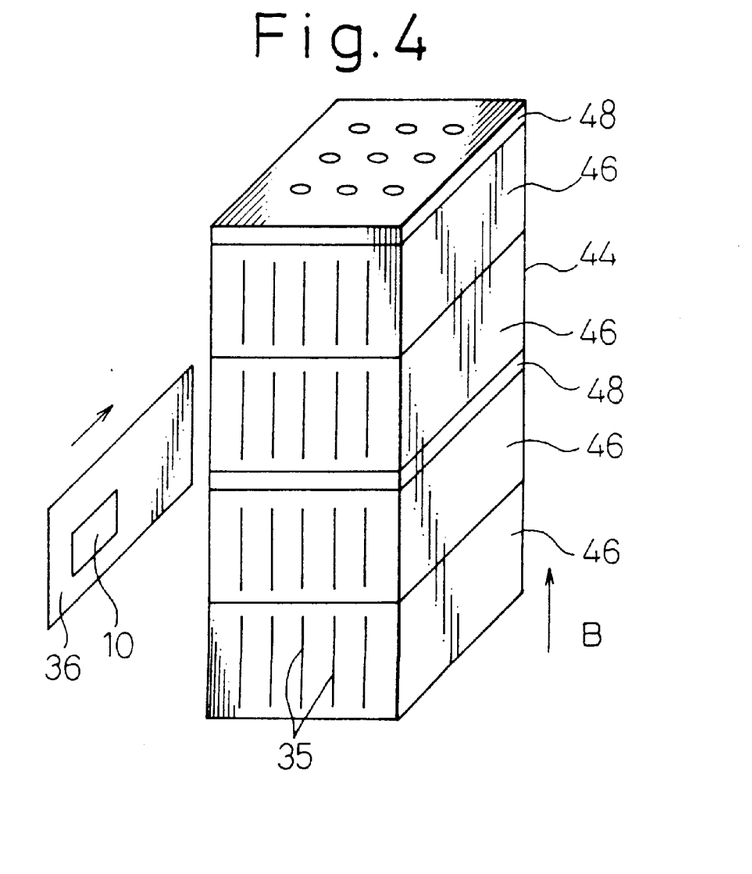
FIG. 4 is a perspective view showing a rack in which the electronic device of FIGS. 1 and 2 is arranged.

FIG. 4 is a perspective view showing a rack 44 used with a communication system. The rack 44 has a plurality of shelves 46, and a plurality of printed circuit boards 35 are removably inserted in each of the shelves 46. The second printed board 36 of FIGS. 1 and 2 with the electronic device 10 mounted thereto can be inserted in one of the shelves 46 as one of the printed boards 35. The electronic device 10 functions as an MPU, for example, in the rack 44.

The rack 44 further has fan units 48 so that cooling air flows in the direction shown by the arrow B in the rack 44. The first fins 24 and the second fins 30 of the electronic device 10 extend in the direction parallel to the arrow B, and the cooling air passes along the paths between the first fins 24 and the paths between the second fins 30 to thereby cool the first fins 24 and the second fins 30, thus cooling the circuit part 14.

Figure 5:
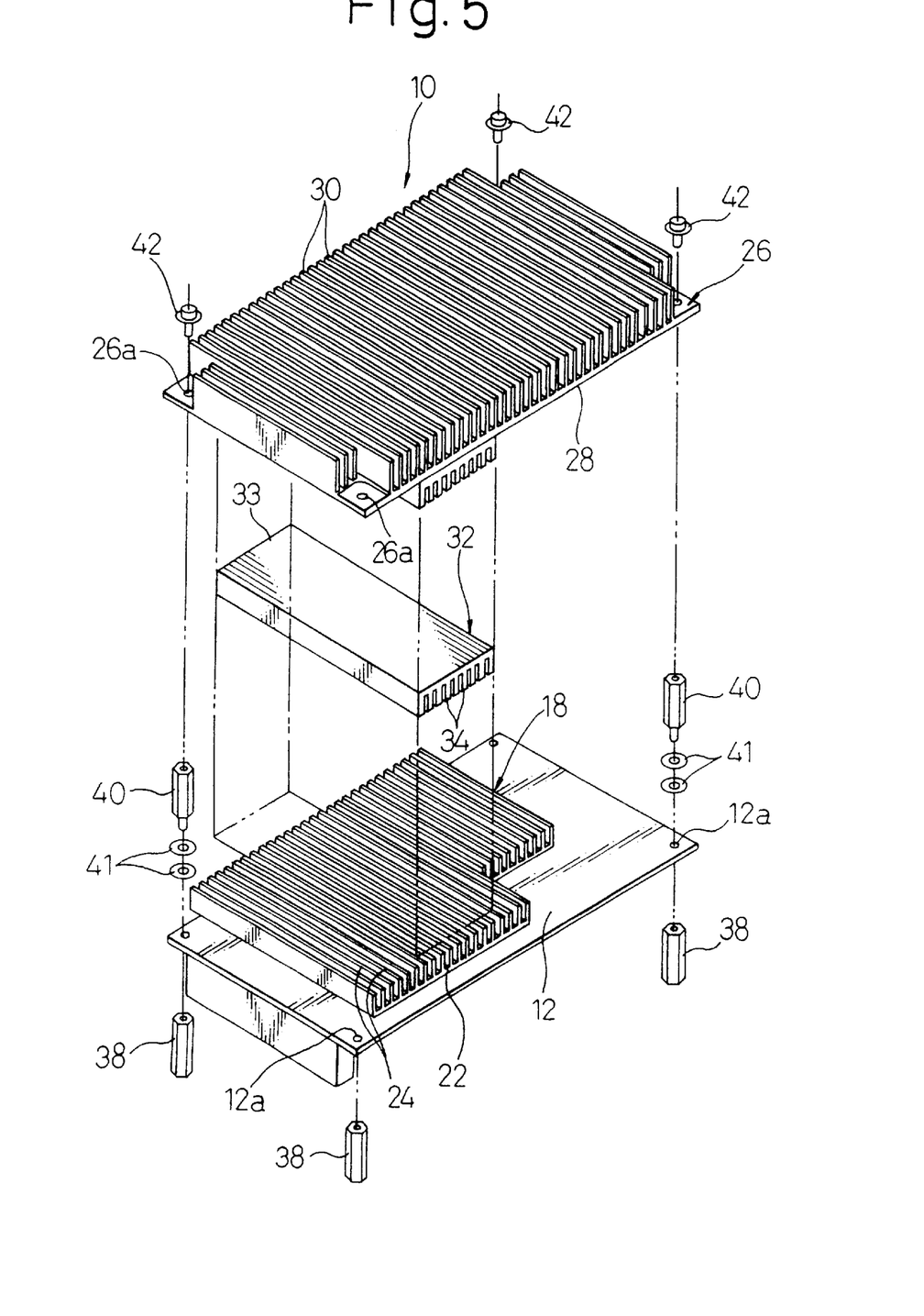
FIG. 5 is an exploded perspective view showing an electronic device according to the second embodiment of the present invention.
Figure 6:
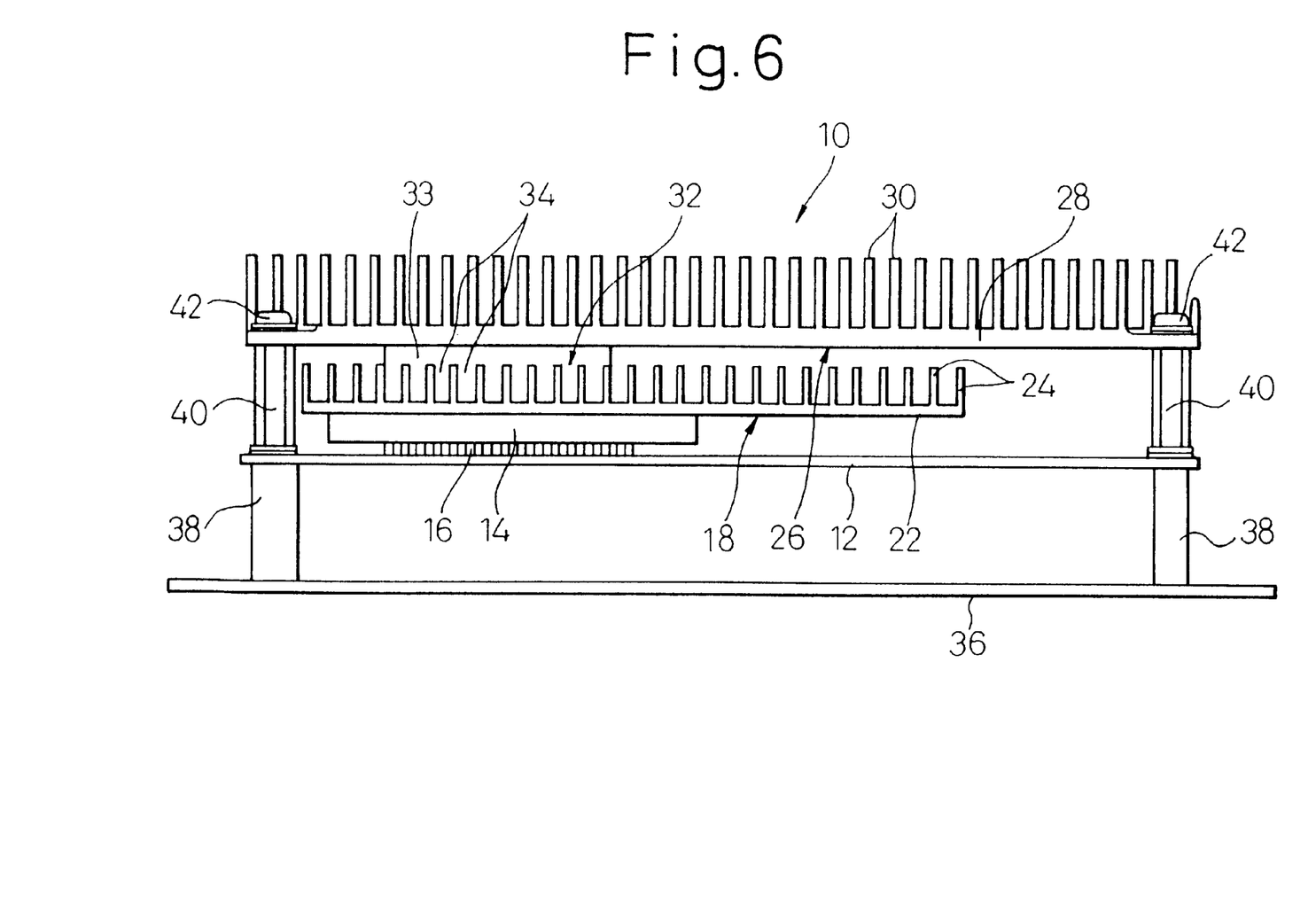
FIG. 6 is a side view of the electronic device of FIG. 5.

FIGS. 5 and 6 show the second embodiment of the present invention. This embodiment is very similar to the embodiment of FIGS. 1 and 2. Specifically, the electronic device 10 includes a substrate 12, a circuit part 14 mounted to the substrate 12, a first heat radiation member 18 kept in contact with the circuit part 14, an intermediate member 32, and a second heat radiation member 26 coupled to the first heat radiation member 18 by an intermediate member 32. Screws 20 for mounting the first heat radiation member 18 to the circuit part 14 are not shown in FIG. 5.

In this embodiment, the intermediate member 32 is formed separately from the second heat radiation member 26. Specifically, the second heat radiation member 26 has a second base portion 28 in the form of a flat plate and second fins 30, and the intermediate member 32 has a third base portion 33 in the form of a flat plate and third fins 34. After the third fins 34 of the intermediate member 32 are fitted in or on and bonded to the first fins of the first heat radiation member 18, the second base portion 28 of the second heat radiation member 26 is fixed to the third base portion 33 of the intermediate member 32 by an adhesive.

In this way, the intermediate member 32 can be easily coupled to the first heat radiation member 18 by forming the intermediate member 32 separately from the second heat radiation member 26, and coupling only the intermediate member 32 to the first heat radiation member 18. In addition, in the case of the above-mentioned integral structure, the second heat radiation member 26 will be displaced with respect to the electronic device 10, thereby adversely affecting the arrangement of the distance rods 38, 40, if the third fins 34 of the intermediate member 32 are not correctly located relative to the first fins 24 of the first heat radiation member 18 (when the first fins 24 are arranged obliquely, for example).

In the case where the intermediate member 32 is formed separately from the second heat radiation member 26, however, the intermediate member 32 can be easily attached to the first heat radiation member 18 and the above-mentioned displacement can be absorbed when mounting the second heat radiation member 26 on the intermediate member 32.

Further, as to the first fins 24 of the first heat radiation member 18 of a different type, the second heat radiation member 26 can be commonly used, by simply changing the intermediate member 32.

For reducing the cost and weight, the first heat radiation member 18 is preferably made of aluminum and the second heat radiation member 26 is also made of aluminum. In the case where the intermediate member 32 is formed separately from the second heat radiation member 26, the intermediate member 32 is preferably sometimes formed of a material different from the second heat radiation member 26. For example, the second heat radiation member 26 is made of aluminum while the intermediate member 32 is made of copper which has higher heat conductivity. By doing so, heat generated by the circuit part 14 can be efficiently transmitted from the first heat radiation member 18 to the second heat radiation member 26 through the intermediate member 32 having a superior heat conductivity. Especially when the area of the intermediate member 32 is small as described above, the intermediate member 32 is preferably made of a material having a superior heat conductivity.

Figure 7:
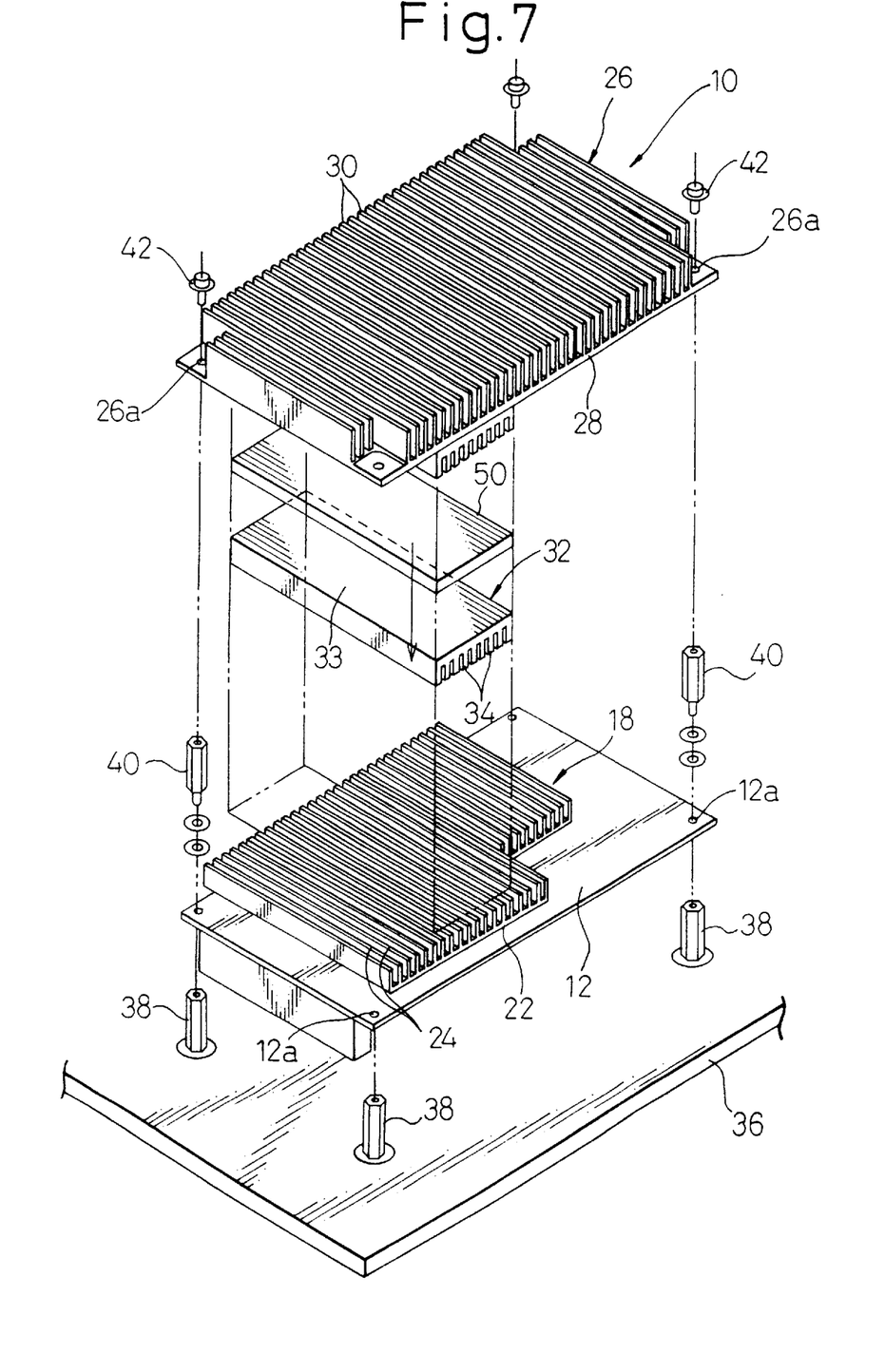
FIG. 7 is an exploded perspective view showing an electronic device according to the third embodiment of the present invention.

FIG. 7 shows the third embodiment of the present invention. This embodiment is very similar to the embodiment of FIGS. 5 and 6. Specifically, the electronic device 10 includes a substrate 12, a circuit part 14 attached to the substrate 12, a first heat radiation member 18 kept in contact with the circuit part 14, an intermediate member 32, and a second heat radiation member 26 coupled to the first heat radiation member 18 by the intermediate member 32. In this embodiment too, the intermediate member 32 is formed separately from the second base portion 28.

Further, a layer 50 for enhancing the degree of contact is arranged between the third base portion 33 of the intermediate member 32 and the second base portion 28 of the second heat radiation member 26. Specifically, the second base portion 28 of the second heat radiation member 26 is fixed to the third base portion 33 of the intermediate member 32 by an adhesive in the embodiment described above, but the fixation by the adhesive is not necessary.

In the case, the second heat radiation member 26 is not necessarily bonded to the intermediate member 32, as long as the second heat radiation member 26 is air-tightly attached to the intermediate member 32 without any air layer therebetween (free of an air layer), since the second heat radiation member 26 is fixed to the substrate 12 by the distance rods 38 and 40. By removably arranging the second heat radiation member 26 on the intermediate member 32, it is possible to replace the second heat radiation member 26 when the operating temperature condition changes. The layer 50 is preferably made of a material that not only enhances close contact but also higher conductivity. For example, the layer 50 is formed of grease or a resin of high heat conductivity. In addition, if an adhesive is used, the adhesive having a higher heat conductivity is used.

Figure 8:
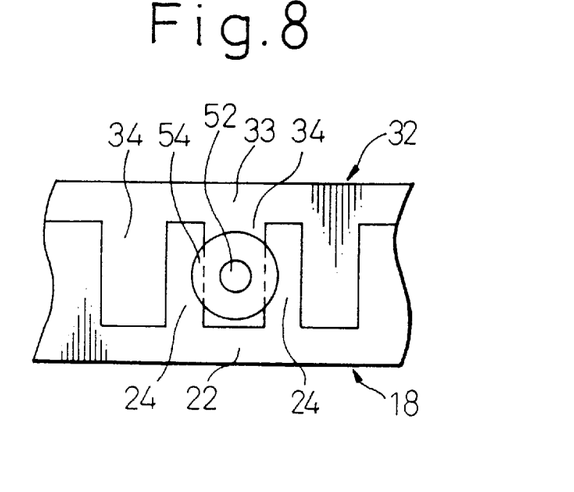
FIG. 8 is a view showing a modification of the connection between the first heat radiation member and the intermediate member.
Figure 9:
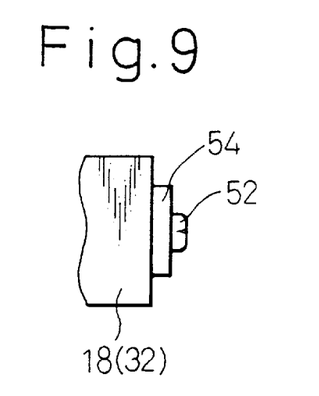
FIG. 9 is a partial side view of the first heat radiation member and the intermediate member of FIG. 8.

FIG. 8 shows a modification of the connection between the first heat radiation member 18 and the intermediate member 18. FIG. 9 is a side view of the first heat radiation member 18 and the intermediate member 32 of FIG. 8. A screw 52 is arranged on each side of the third fin 34 of the intermediate member 32 via a washer 54. The washer 54 is wider than the third fin 34 and covers the first fins 24 adjacent to the third fin 34. The washer 54 frictionally engages with the first fins 24 and functions to anchor the third fin 34 to the first fins 24. Therefore, grease may be filled between the third fins 34 and the first fins, 24 instead of fixing the intermediate member 32 and the first heat radiation member 18 to each other with an adhesive. In the case where the intermediate member 32 and the first heat radiation member 18 are fixed to each other with an adhesive, the screw 52 and the washer 54 function as a provisional fastener before the adhesive is set completely.

Figure 10:
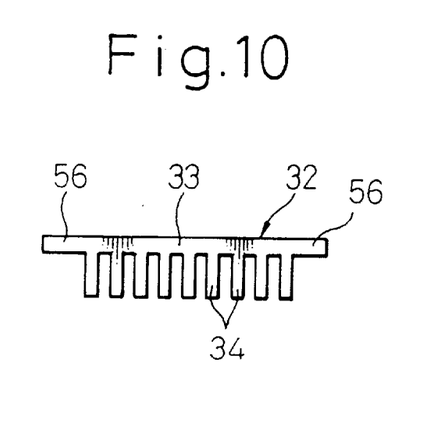
FIG. 10 is a view showing a modification of the intermediate member.

FIG. 10 shows a modification of the intermediate member 32. The third base portion 33 of the intermediate member 32 includes a portion 56 extending laterally from the range in which the third fins 34 are arranged. This intermediate member 32 is effective especially when it is made separately from the second heat radiation member 26 as shown in FIGS. 5 to 7 and has a heat conductivity superior to that of the second heat radiation member 26. In other words, the range in which the third fins 34 are arranged is smaller, but the heat transmission performance from the intermediate member 32 to the second heat radiation member 26 can be higher.

Figure 11:
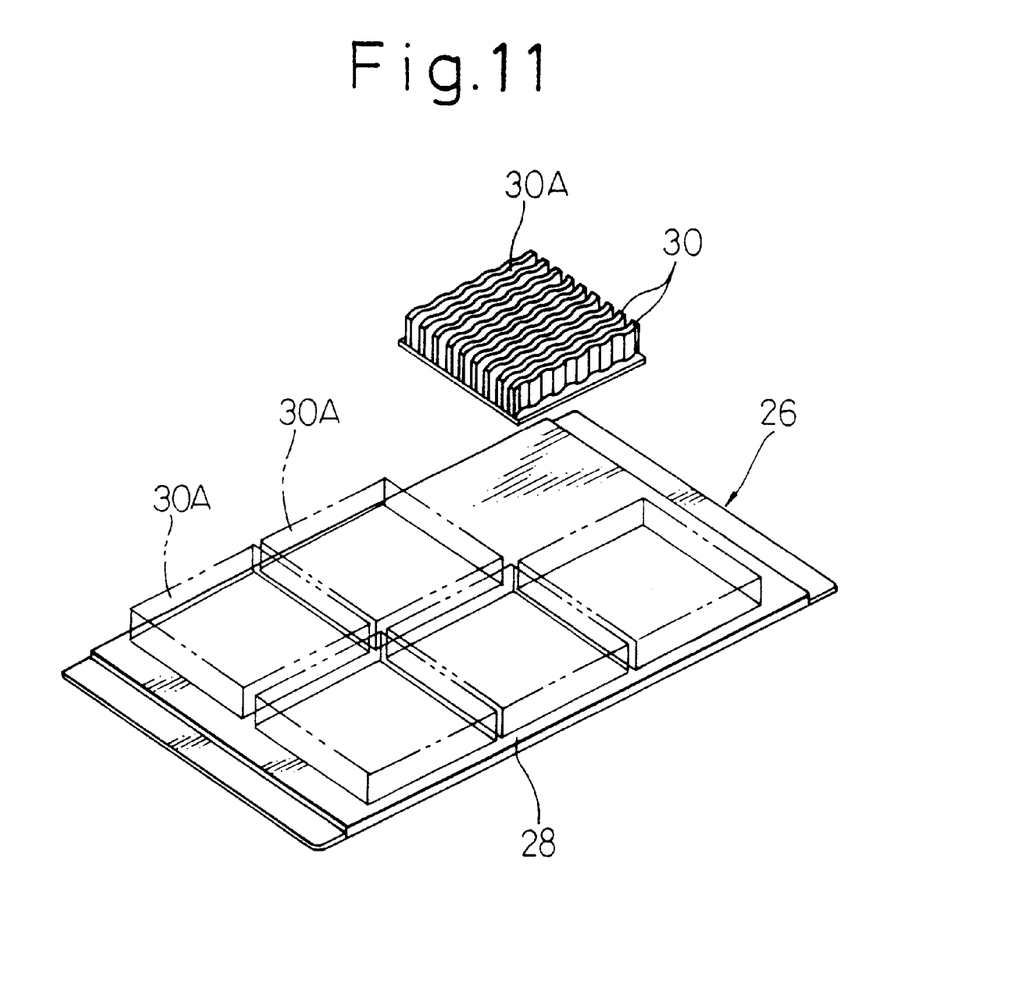
FIG. 11 is a perspective view showing an electronic device according to the fourth embodiment of the present invention.

FIG. 11 shows the fourth embodiment of the present invention. This embodiment includes a second heat radiation member 26 similar to that used in the electronic device 10 according to the above-mentioned embodiments. The second heat radiation member 26 has a second base portion 28 in the form of a flat plate and second fins 30. The second fins 30 are divided into a plurality of fin areas 30A. Each fin area 30A is removably attached to the second base portion 28. As a result, a plurality of standardized fin areas 30A are prepared and the required radiation performance can be satisfied by changing the number of the fin areas 30A.

Figure 12:
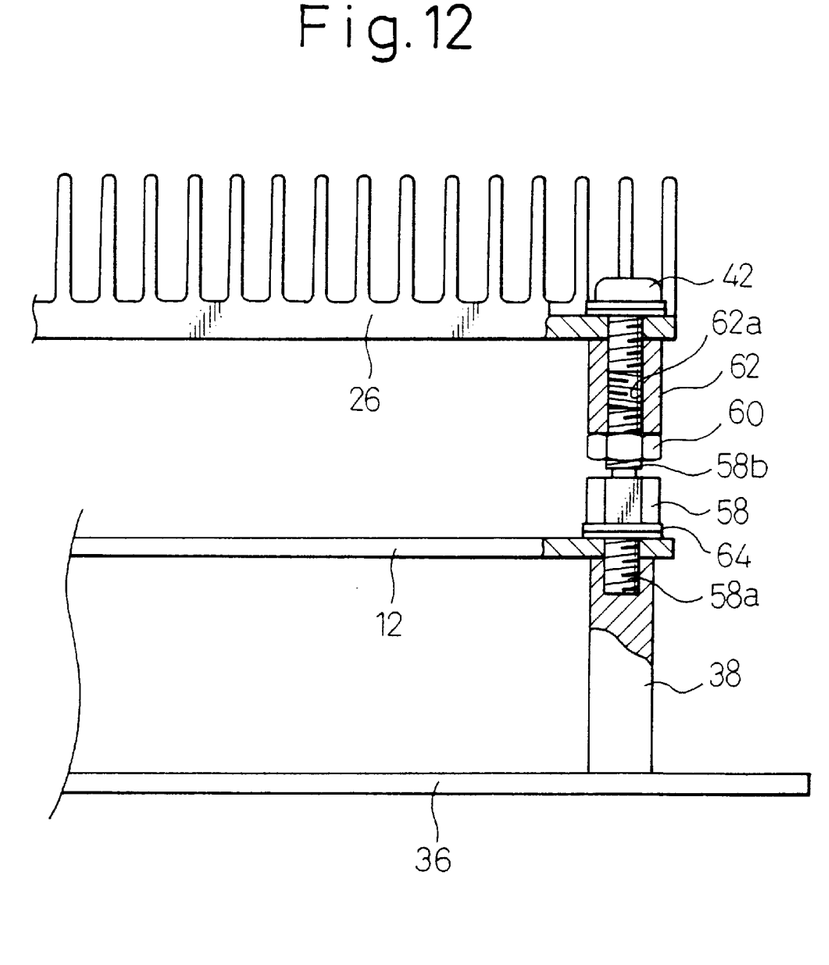
FIG. 12 is a side view, with a partial cross-section, showing an electronic device according to the fifth embodiment of the present invention.
Figure 13:
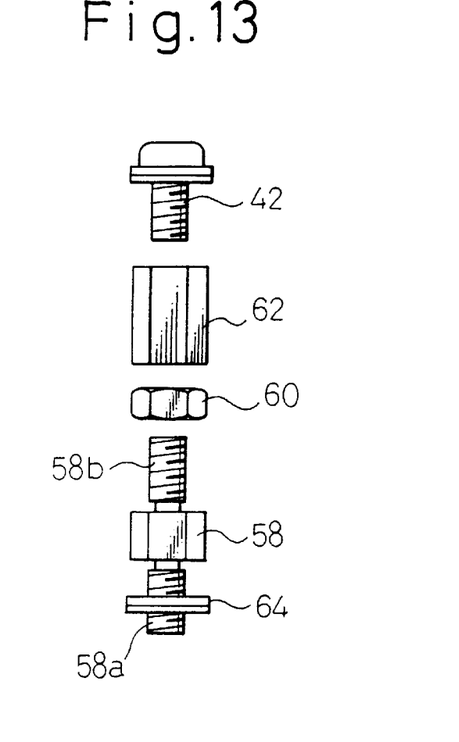
FIG. 13 is an exploded side view showing the fastener of FIG. 12.

FIG. 12 shows the fifth embodiment of the present invention. FIG. 13 shows the arrangement of the fastener of FIG. 12. In this embodiment, the second heat radiation member 26 is adjustably fixed to the first substrate 12 with the third fins 34 of the intermediate member 32 (not shown in FIG. 12) in close contact with the first fins 24 of the first heat radiation member 18. The fastener includes distance rods 38, distance bolts 58, adjust nuts 60 and distance bolts 62. The spacing bolt 58 has a lower end thread 58a and an upper end thread 58b, with a washer 64 arranged at the lower end thread 58a. The distance bolt 62 has an internal thread 62a.

The substrate 12 can be mounted to the second printed board 36 by the lower end screws 58a of the distance bolts 58 and the distance rods 38, as described with reference to FIGS. 1 and 2. The adjust nut 60 and the distance bolt 62 engage the upper end 58b of the spacing bolt 58. In the process, the adjust nut 60 functions as a stopper at an appropriate position where the distance bolts 62 come into contact with the adjust nuts 60. As a result, the position of the distance bolts 62 can be adjusted in accordance with the position of the adjust nuts 60.

The second heat radiation member 26 rests on the upper ends of the distance bolts 62, so that the screws 42 are screwed to the internal threads 62a of the distance bolts 62 through the holes of the second heat radiation member 26. Consequently, the second heat radiation member 26 is fixed to the substrate 12 with a space determined by the distance bolts 62. Four fasteners are arranged at the four corners of the second heat radiation member 26, and when the screws 42 are provisionally fastened to the distance bolts 62, the contact condition between the second base portion 28 of the second heat radiation member 26 and the third base portion 33 (not shown in FIG. 12) of the intermediate member 32 is checked.

If a partial gap exists between the second base portion 28 of the second heat radiation member 26 and the third base portion 33 of the intermediate member 32, the height of one or a plurality of adjust nuts 60 and the distance bolts 62 is adjusted. The screws 42 are fastened tightly when the air layer is eliminated between the second base portion 28 of the second heat radiation member 26 and the third base portion 33 of the intermediate member 32 in this way. As a result, the heat transmission from the intermediate member 32 to the second heat radiation member 26 is improved. Also, less stress is exerted on the electronic device 10.

Figure 14:
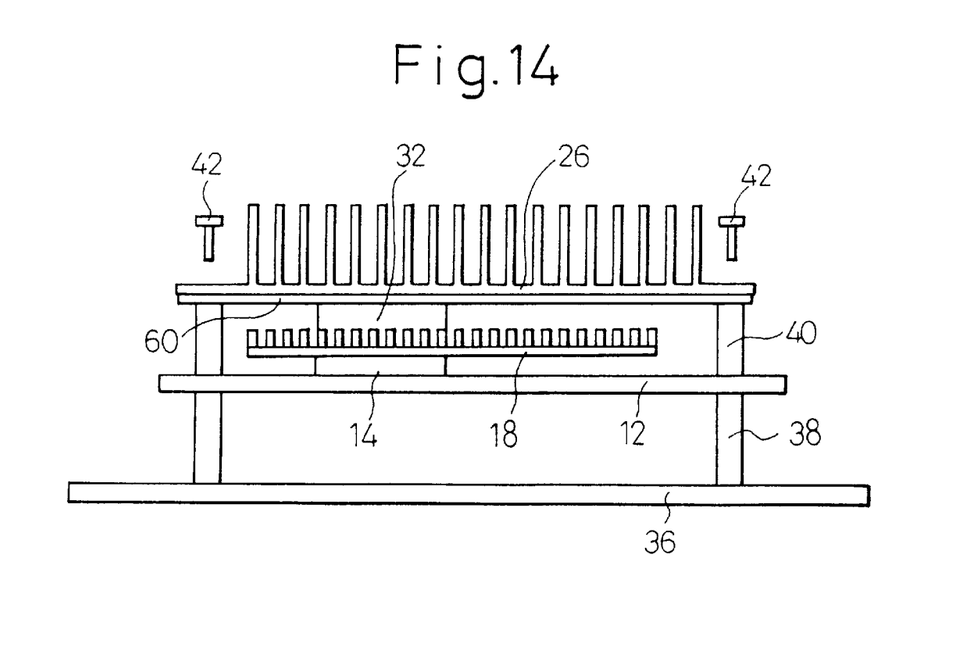
FIG. 14 is a side view showing an electronic device according to the sixth embodiment of the present invention.

FIG. 14 shows the sixth embodiment of the present invention. In this embodiment, the second base portion 28 of the second heat radiation member 26 includes a layer 60 of a higher heat conductivity. The higher heat conductivity layer 60 is made of a copper foil or a heat pipe and bonded to the surface of the second base portion 28 or embedded in the second base portion 28. The higher heat conductivity layer 60 causes heat to be transmitted to a wide area of the second heat radiation member 26 for an improved heat radiation effect.

Figure 15:
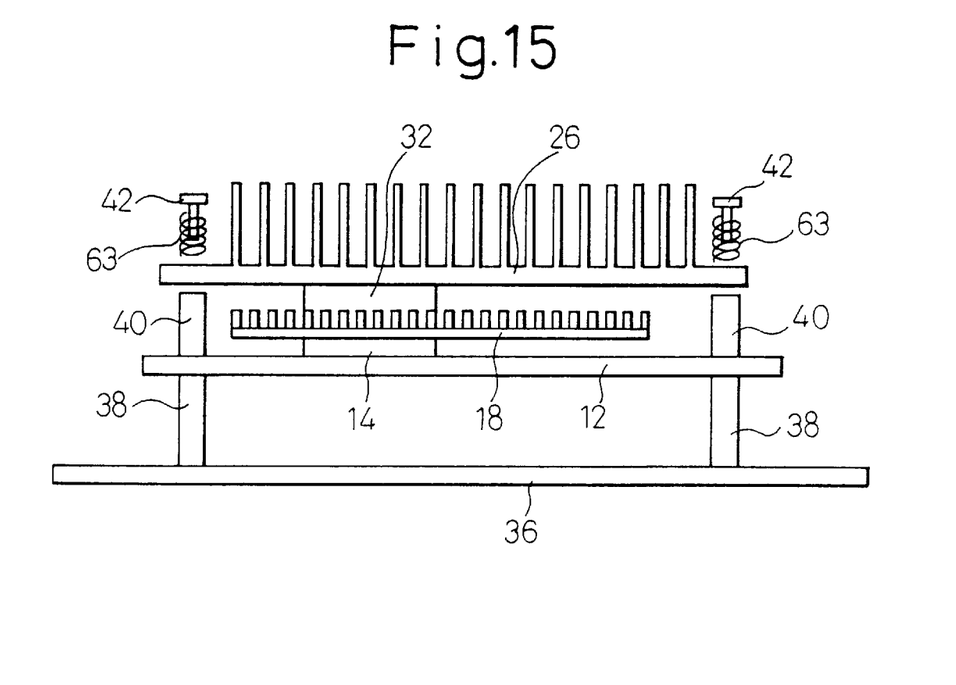
FIG. 15 is a side view showing an electronic device according to the seventh embodiment of the present invention.

FIG. 15 shows the seventh embodiment of the present invention. In this embodiment, the second heat radiation member 26 is fixed to the substrate 12 on which the circuit part 14 is mounted by a spring member 63. The spring member 63 is arranged between the distance rods 40 and the screws 42 and works to urge the second heat radiation member 26 toward the substrate 12 by the spring force.

Figure 16:
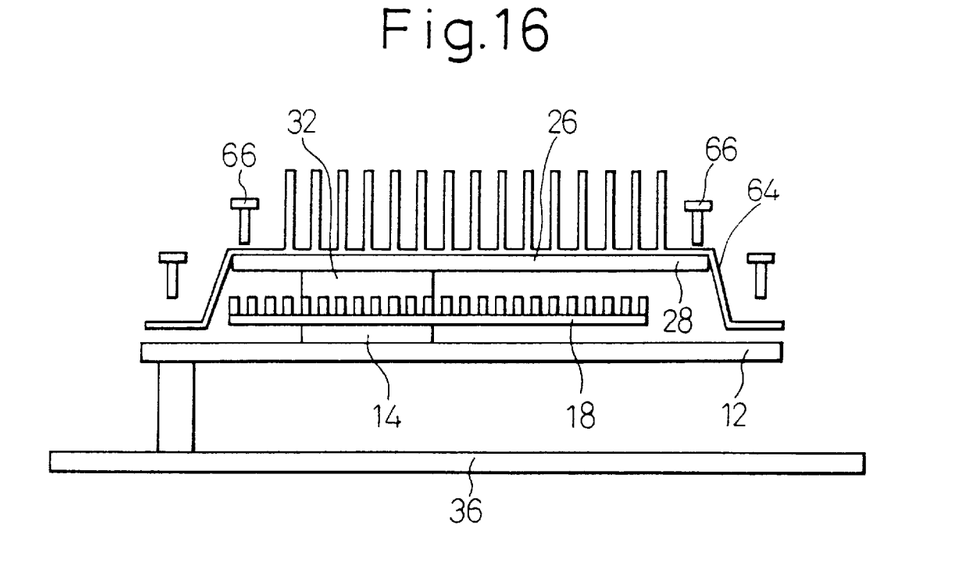
FIG. 16 is a side view showing an electronic device according to the eighth embodiment of the present invention.
Figure 17:
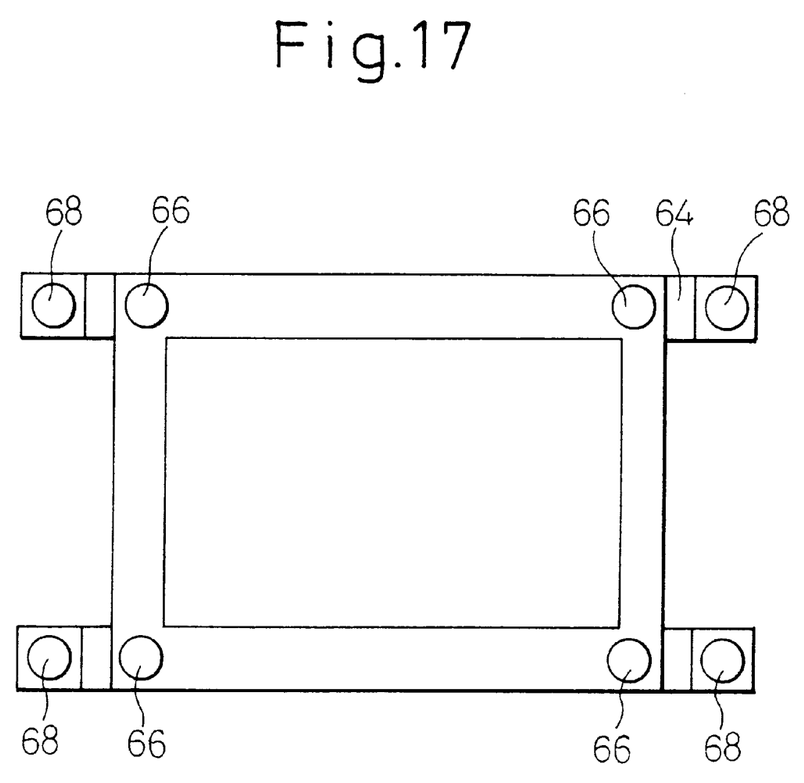
FIG. 17 is a plan view of FIG. 16.

FIGS. 16 and 17 show the eighth embodiment of the present invention. In this embodiment too, the second heat radiation member 26 is fixed to the substrate 12 on which the circuit part 14 is mounted by a spring member 64. The spring member 64 is made of a spring plate and includes a central portion fixed by screws 66 to the second base portion 28 of the second heat radiation member 26 and end portions extending from the two sides of the central portion and fixed to the substrate 12 by screws 68.

In this way, by fixing the second heat radiation member 26 to the substrate 12 by the spring members 63 and 64, the intermediate member 32 and the second heat radiation member 26 can be positively brought into contact with the circuit part 14 and the intermediate member 32, respectively, without imposing an excessively heavy mechanical load on the circuit part 14.

As described above, according to the present invention, an electronic device having a heat radiation characteristic suitable for a desired operating temperature condition can be obtained by adding a new heat radiation member to a circuit part which includes an initially attached heat radiation member.

What is claimed is:

1. An electronic device comprising a circuit part;
a first heat radiation member having a first base portion in contact with said circuit part and first fins arranged on said first base portion for radiating heat generated by said circuit part;
a second heat radiation member having a second base portion and second fins arranged on said second base portion; and
an intermediate member having a third base portion and third fins arranged on said third base portion, said third fins of said intermediate member being fitted in said first fins, the third base portion of said intermediate member being coupled to the second base portion of said second heat radiation member, wherein the third base portion of said intermediate member is smaller than the first base portion of said first heat radiation member.

2. An electronic device as described in claim 1, characterized in that the second base portion of said second heat radiation member is larger than the base portion of the first heat radiation member.

3. An electronic device as described in claim 1, characterized in that the third base portion of said intermediate member is substantially equal to or larger than a heat-generating area of said circuit part.

4. An electronic device as described in claim 1, characterized in that said intermediate member is formed integrally with said second heat radiation member.

5. An electronic device as described in claim 1, characterized in that said intermediate member is formed separately from said second heat radiation member.

6. An electronic device as described in claim 5, characterized in that said intermediate member is formed of a material different from said second heat radiation member.

7. An electronic device as described in claim 5, characterized in that the third base portion of said intermediate member includes a portion which laterally extends from the range in which said third fins are arranged.

8. An electronic device as described in claim 5, characterized in that the third base portion of said intermediate member is bonded to the second base portion of said second heat radiation member.

9. An electronic device as described in claim 5, characterized in that a layer for enhancing the degree of contact is interposed between the third base portion of said intermediate member and the second base portion of said second heat radiation member.

10. An electronic device as described in claim 5, characterized in that the second base portion of the second heat radiation member includes a layer of high heat conductivity.

11. An electronic device as described in claim 1, characterized in that the second fins of the second heat radiation member are divided into a plurality of fin areas, each of said fin areas being removably mounted to the second base portion.

12. An electronic device as described in claim 1, characterized in that said circuit part is mounted to a first substrate.

13. An electronic device as described in claim 12, characterized in that the second heat radiation member is fixed to said first substrate.

14. An electronic device as described in claim 13, characterized in that the second heat radiation member is fixed adjustably to said first substrate.

15. An electronic device as described in claim 13, characterized in that said first substrate is fixed to a second substrate by fasteners, and the second heat radiation member is fixed to said first substrate using said fasteners.

16. An electronic device as described in claim 1, characterized in that the second heat radiation member is fixed by a spring member to a substrate on which the circuit part is mounted.

* * * * *